(12) United States Patent
Ryu et al.

(10) Patent No.: US 7,714,440 B2
(45) Date of Patent: May 11, 2010

(54) METAL INTERCONNECTION STRUCTURE OF A SEMICONDUCTOR DEVICE HAVING LOW RESISTANCE AND METHOD OF FABRICATING THE SAME

(75) Inventors: In Cheol Ryu, Icheon-shi (KR); Sung-gon Jin, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 13 days.

(21) Appl. No.: 12/136,497

(22) Filed: Jun. 10, 2008

(65) Prior Publication Data
US 2008/0237864 A1 Oct. 2, 2008

Related U.S. Application Data

(62) Division of application No. 11/268,350, filed on Nov. 7, 2005, now Pat. No. 7,452,801.

(30) Foreign Application Priority Data
Apr. 26, 2005 (KR) ............................... 2005-34759

(51) Int. Cl.
*H01L 23/532* (2006.01)
(52) U.S. Cl. .............. 257/751; 257/758; 257/762; 257/763; 257/765; 257/E23.157

(58) Field of Classification Search ........... 257/751, 257/758, 762, 763, 765, E23.145, E23.157; 438/672
See application file for complete search history.

(56) References Cited

U.S. PATENT DOCUMENTS

| 5,442,235 A | * | 8/1995 | Parrillo et al. | 257/758 |
| 5,913,141 A | * | 6/1999 | Bothra | 438/625 |
| 6,284,646 B1 | * | 9/2001 | Leem | 438/629 |

FOREIGN PATENT DOCUMENTS

| KR | 10-2003-0050655 | 6/2003 |
| KR | 10-2004-0043219 | 5/2004 |

* cited by examiner

*Primary Examiner*—M. Wilczewski
*Assistant Examiner*—Toniae M Thomas
(74) *Attorney, Agent, or Firm*—Marshall, Gerstein & Borun LLP

(57) ABSTRACT

Provided is a metal interconnection structure of a semiconductor device, including a first metal film pattern disposed on an upper part of an insulation film of a semiconductor substrate; an intermetallic dielectric film having a metal contact plug in which a barrier layer, a metal film for contact plug and a second metal film are sequentially disposed, on the first metal film pattern; and a second metal film pattern disposed on the metal contact plug and intermetallic dielectric film and connected to the metal contact plug.

5 Claims, 4 Drawing Sheets

METAL INTERCONNECTION STRUCTURE OF A SEMICONDUCTOR DEVICE HAVING LOW RESISTANCE AND METHOD OF FABRICATING THE SAME

CROSS-REFERENCE TO RELATED APPLICATION

This application is a divisional of application Ser. No. 11/268,350 filed Nov. 7, 2005 which is based on Korean Patent Application 2005-34759, filed Apr. 26, 2005.

BACKGROUND OF THE INVENTION

1. Field of the Invention

The present invention relates to a semiconductor device and a method of fabricating the same, and more particularly to a metal interconnection structure of a semiconductor device having low resistance and a method of fabricating the same.

2. Description of the Related Art

Recently, the increased degree of integration of semiconductor memory devices has led to miniaturization and high densification thereof. However, such high integration enables reduction of the device size and integration of the circuits having sophisticated functions into the device and as a result, increased lengths of signal lines providing connection between the devices. Therefore, reduction of a signal line length is absolutely necessary for enhancing operating speed of integrated circuits. For this purpose, complicated circuits of the devices have been implemented by reducing the contact length and contact resistance between devices via formation of metal interconnection as a multi-layer structure.

FIG. 1 is a cross-sectional view showing a conventional metal interconnection structure of a semiconductor device.

As shown in FIG. 1, a first metal film pattern 110 is disposed on an upper part of an insulation film 105 of a semiconductor substrate 100. An intermetallic dielectric film 120 is disposed on the first metal film pattern 110. A metal contact plug 140, which is electrically connected through the intermetallic dielectric film 120 to the first metal film pattern 110, is disposed on the intermetallic dielectric film 120. A barrier layer 130 is disposed on side walls and bottom surface of the metal contact plug 140. The metal contact plug 140 is formed of a tungsten film. A second metal film pattern 150 is disposed on the upper surface of the metal contact plug 140. The second metal film pattern 150 is formed of an aluminum film.

In such metal interconnection structure of the semiconductor device, electrical connection between the first metal film pattern 110 and second metal film pattern 150 is achieved via the metal contact plug 140 composed of tungsten, as previously described. Since tungsten, constituting the metal contact plug 140, has characteristics similar to a thermal expansion coefficient of a material constituting the semiconductor substrate, for example, silicon, and is a high-melting point metal, it can be advantageously applied in the inhibition of electron detachment and a high temperature process. In addition, upon performing chemical vapor deposition (CVD), tungsten exhibits excellent step coverage and thus provides superior properties to vacuum deposition or sputtering.

However, tungsten is a material having relatively high specific resistance as compared to other metal interconnection films such as aluminum. Nonetheless, the reason why tungsten is used as the metal contact plug is that tungsten has, as mentioned above, excellent step coverage and thus is better at filling a via-hole than aluminum or copper having relatively low specific resistance. However, frequency of usage of the metal contact plug is also increased in metal interconnection structures showing a trend toward use of multi-layer structures and as a result, electrical properties of devices are gradually degraded due to a high specific resistance of tungsten.

SUMMARY OF THE INVENTION

Therefore, the present invention has been made in view of the above problems, and it is an object of the present invention to provide a metal interconnection structure of a semiconductor device having relatively low resistance in order to improve electrical properties thereof.

It is another object of the present invention to provide a method of fabricating such a metal interconnection structure of a semiconductor device.

In accordance with an aspect of the present invention, the above and other objects can be accomplished by the provision of a metal interconnection structure of a semiconductor device, comprising:

a first metal film pattern disposed on an upper part of an insulation film of a semiconductor substrate;

an intermetallic dielectric film disposed on the first metal film pattern and insulation film, and having a via-hole exposing the upper surface of the first metal film pattern;

a first metal contact plug disposed on the lower part of the via-hole such that the first metal contact plug contacts the upper surface of the first metal film pattern, and made of a metal film having a first specific resistance;

a second metal contact plug disposed on the upper part of the first metal contact plug while filling the upper part of the via-hole, and made of a metal film having a second specific resistance lower than the first specific resistance; and a second metal film pattern disposed on the second metal contact plug and intermetallic dielectric film.

The first metal contact plug may be disposed within 65% of a height of the via-hole from the lower part thereof.

The first metal contact plug may be formed of a tungsten film, and the second metal contact plug may be formed of an aluminum film.

The second metal film pattern may be the same metal film as the second metal contact plug.

The second metal film pattern may be formed of an aluminum film or a copper film.

The metal interconnection structure of a semiconductor device in accordance with the present invention may further include a metal barrier layer disposed on the side walls and lower surface of the via-hole.

In accordance with another aspect of the present invention, there is provided a method of fabricating a metal interconnection structure of a semiconductor device, comprising:

forming a first metal film pattern on an upper part of an insulation film of a semiconductor substrate;

forming an intermetallic dielectric film on the insulation film and first metal film pattern;

removing a portion of the intermetallic dielectric film to form a via-hole exposing a partial surface of the first metal film pattern;

forming a first metal contact plug having a first specific resistance on the first metal film pattern such that the lower part of the via-hole is embedded;

forming a metal film having a second specific resistance lower than the first specific resistance on the intermetallic dielectric film and first metal contact plug within the via-hole; and patterning the metal film of the upper part of the intermetallic dielectric film to form a second metal contact plug and second metal film pattern embedding the via-hole in conjunction with the first metal contact plug.

Formation of the first metal contact plug includes forming a metal film for the first metal contact plug on the exposed surface of the first metal film pattern and on the intermetallic dielectric film such that the via-hole is filled, performing planarization to expose the upper surface of the intermetallic dielectric film and removing a portion of the metal film for the first metal contact plug, and etching the metal film for the first metal contact plug to render a portion of the upper part of the via-hole empty.

Herein, etching is preferably carried out such that the first metal contact plug is disposed within 65% of the height of the via-hole.

Further, etching may be carried out by anisotropic etching utilizing SF6 and argon.

Formation of the metal film having the second specific resistance may be carried out by physical vapor deposition (PVD).

As an example of physical vapor deposition (PVD), mention may be made of sputtering.

The method of fabricating a metal interconnection structure of a semiconductor device in accordance with the present invention may further include cleaning the first metal contact plug prior to forming the metal film having a second specific resistance.

Herein, cleaning may be carried out utilizing a cleaning solution containing a fluorine source, in order to remove an oxide film.

The first metal contact plug may be formed of a tungsten film.

The second metal contact plug and the second metal film pattern may be formed of an aluminum film or a copper film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
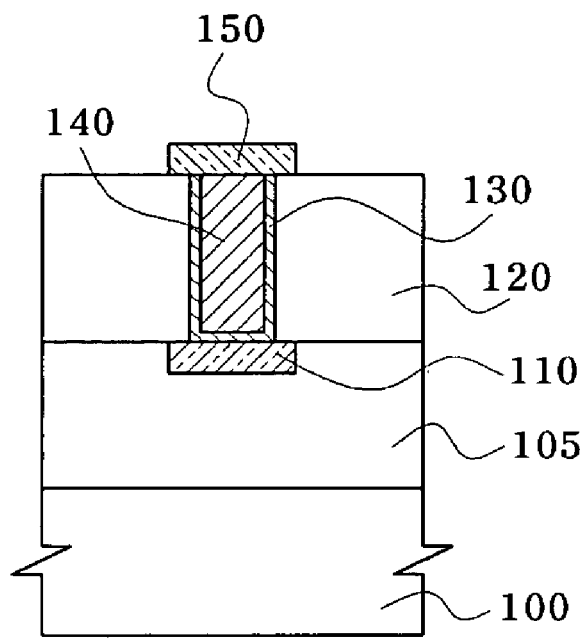
FIG. 1 is a cross-sectional view showing a metal interconnection structure of a semiconductor device in accordance with a conventional art.

Now, preferred embodiments of the present invention will be described in more detail with reference to the accompanying drawings, such that those skilled in the art can easily practice the present invention.

In the drawings, thicknesses of various layers and regions are exaggerated for clarity. Like numbers refer to like elements throughout the specification and drawings.

Figure 2A:
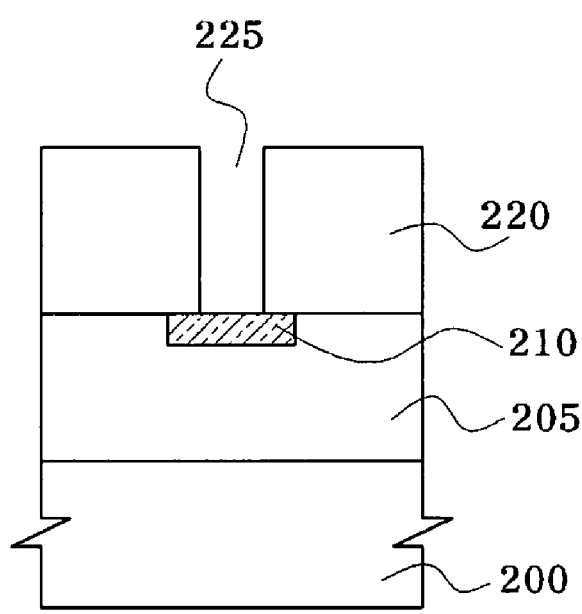
FIGS. 2a through 2f are cross-sectional views illustrating a method of fabricating a metal interconnection structure of a semiconductor device in accordance with the present invention.
Figure 2B:
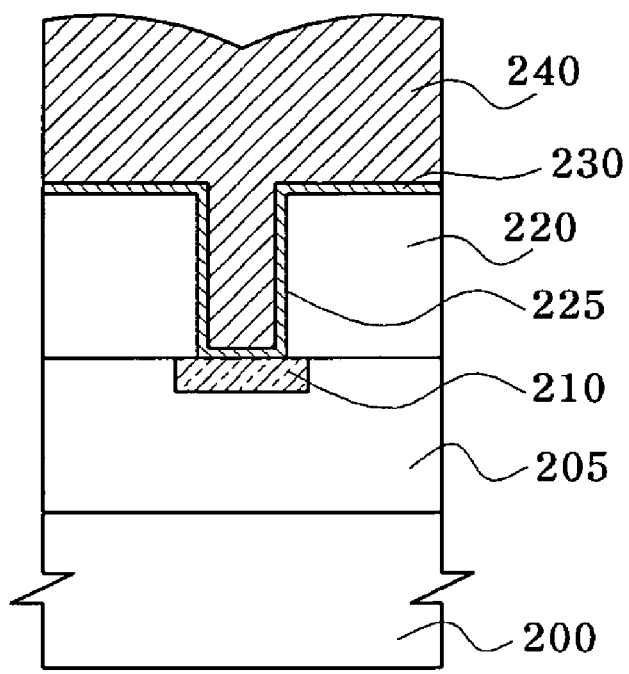
Figure 2C:
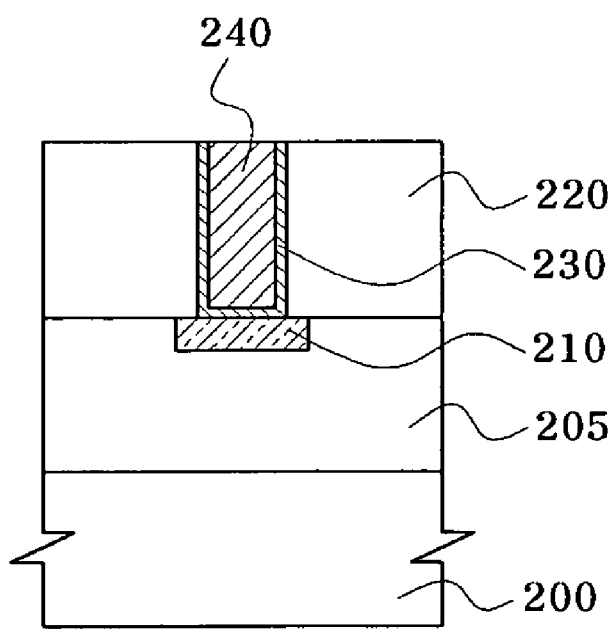
Figure 2D:
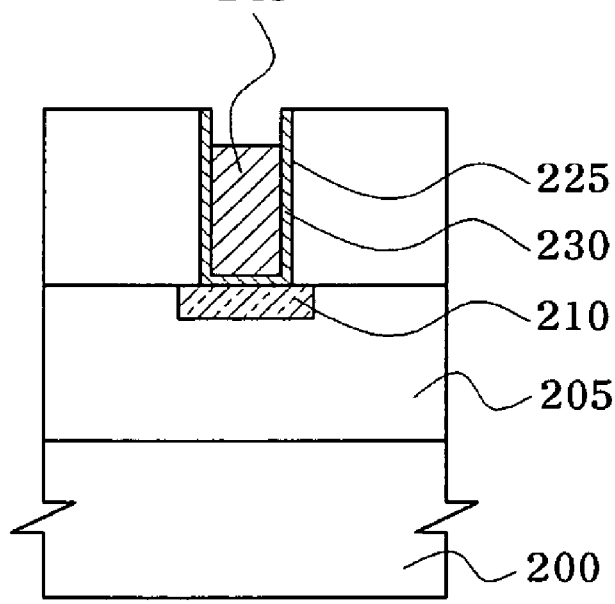
Figure 2E:
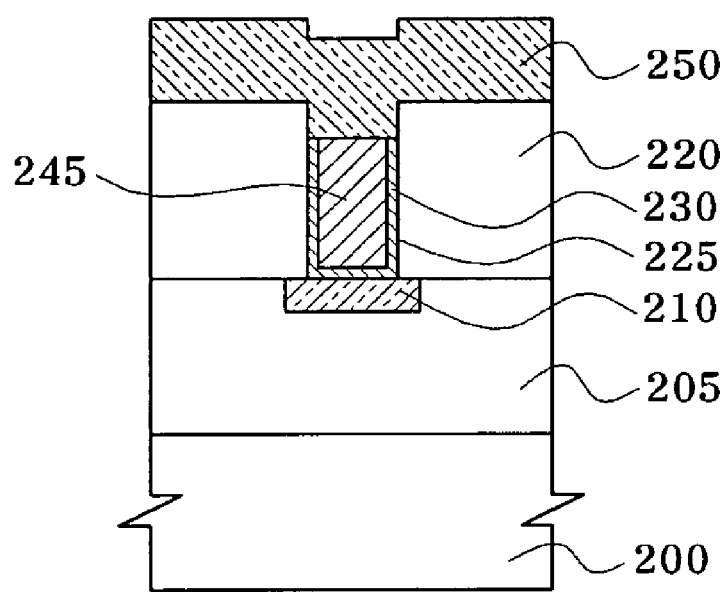
Figure 2F:
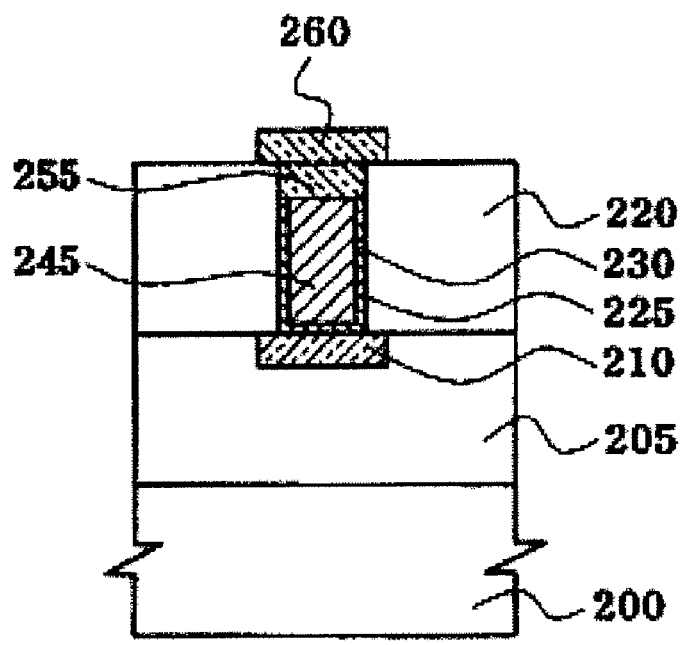

FIG. 2f is a cross-sectional view showing a metal interconnection structure of a semiconductor device in accordance with the present invention. Referring to FIG. 2f, a first metal film pattern 210 is disposed on an upper part of an insulation film 205 of a semiconductor substrate 200. An intermetallic dielectric film 220 having a via-hole 225 exposing an upper surface of the first metal film pattern 210 is disposed on the first metal film pattern 210 and insulation film 205. A barrier layer 230 is disposed within the via-hole 225 and a first metal contact plug 245 is disposed on the barrier layer 230. Herein, the first metal contact plug 245 is disposed to have a thickness corresponding to a depth within about 65% from the bottom of the via-hole 225 while not completely filling the via hole 225. The first metal contact plug 245 is made of tungsten. The upper part of the via-hole 225, which was not filled with the first metal contact plug 245, is filled with a metal film 250 for the second metal contact plug. The metal film 250 for the second metal contact plug is a metal film having specific resistance lower than the first metal contact plug 245. For example, when the first metal contact plug 245 is a tungsten film, the metal film 250 for the second metal contact plug is made of an aluminum film or a copper film. The metal film 250 for the second metal contact plug completely fills the via-hole 225 and extends thereover, thereby serving as a second metal film pattern 255. If necessary, the second metal film pattern 255 may be disposed using a metal film different from the metal film 250 for the second metal contact plug.

In such a structure, resistance of the overall metal contact plug can be lowered using the first metal contact plug 245 having relatively a high specific resistance, in conjunction with the metal film 250 for the second metal contact plug having relatively lower specific resistance, as a metal contact plug filling the via-hole 225.

FIGS. 2a through 2f are cross-sectional views illustrating a method of fabricating a metal interconnection structure of a semiconductor device in accordance with the present invention First, referring to FIG. 2a, a first metal film pattern 210 is formed on an upper part of an insulation film 205 of a semiconductor substrate 200. Then, an intermetallic dielectric film 220 is formed on the insulation film 205 and first metal film pattern 210, and a portion of the intermetallic dielectric film 220 is removed to form a via-hole 225 exposing a partial surface of the first metal film pattern 210.

Next, referring to FIG. 2b, a barrier layer 230 of titanium/titanium nitride (Ti/TiN) is formed on the exposed surface of the first metal film pattern 210 which is exposed by the intermetallic dielectric film 220 and via-hole 225. The metal film 240 for the first contact plug is formed on the barrier layer 230 such that the via-hole 225 is embedded. The metal film 240 for the first contact plug may be formed of a tungsten film via chemical vapor deposition (CVD).

Next, referring to FIG. 2c, a planarization process is carried out on the metal film 240 for the first contact plug and the barrier layer 230, using chemical mechanical polishing, for example, such that the surface of the intermetallic dielectric film 220 is exposed.

Next, referring to FIG. 2d, the upper part of the metal film 240 for the first metal contact plug is removed by the predetermined thickness, thereby forming the first metal contact plug 245. Herein, etching to remove the metal film 240 is carried out via anisotropic etching utilizing SF6 and argon, and removal is effected at a rate of more than 15% of the total depth of the via-hole 225. If necessary, it is possible to obtain the same results as both planarization and etching by only etching the metal film 240 for the first contact plug without planarization. Similarly, etching may be carried out via anisotropic etching utilizing SF6 and argon.

Next, referring to FIG. 2e, the metal film 250 for the second metal contact plug is formed on the first metal contact plug 245 and intermetallic dielectric film 220, having a thickness corresponding to a portion of the via hole 225 from the lower part thereof, i.e., a thickness corresponding to a depth within about 65% from the bottom of the via-hole 225. Herein, the metal film 250 for the second metal contact plug is formed of a metal material having a specific resistance lower than the first metal contact plug 245. For example, when the first metal contact plug 245 is formed of a tungsten film, the metal film 250 for the second metal contact plug is formed of an aluminum (Al) film or a copper (Cu) film. By formation of the metal film 250 for the second metal contact plug using a metal film having relatively low specific resistance, as the ratio of the metal film 250 for the second metal contact plug filled in the via-hole 225 is increased, the overall resistance of the metal contact plug is decreased. For example, it can be confirmed that about a 15% decrease in the overall resistance is achieved when the via-hole 225 is filled with a 80% tungsten film having specific resistance of 12 $\mu\Omega$cm and a 20% aluminum film having specific resistance of 3 $\mu\Omega$cm, as compared to when the via-hole 225 is completely filled only with a tungsten film having a specific resistance of 12 $\mu\Omega$cm. Such a degree of resistance decrease is increased as the ratio of the metal film 250 for the second metal contact plug filled in the via-hole 225 is increased. For example, where the filling ratio of the metal film 250 for the second metal contact plug is 25%, 30% and 40%, the overall decrease rate of resistance is about 19%, 23% and 30%, respectively. The metal film 250 for the second metal contact plug can be formed via physical vapor deposition (PVD) such as sputtering. If necessary, a cleaning process may be carried out employing an etching solution using fluorine (F), so as to remove oxidative foreign materials which are probably present on the first metal contact plug 245 and intermetallic dielectric film 220 in the via-hole 225 after removal thereof, prior to forming the metal film 250 for the second metal contact plug.

Referring to FIG. 2f, a photoresist film pattern (not shown) defining the second metal film pattern-forming region is formed on the metal film 250 for the second metal contact plug (represented by the reference numeral 250 in FIG. 2e), via exposure and development processes according to conventional photolithography, and etching is carried out using the photoresist film pattern as an etch mask, thereby forming a second metal film pattern 255. When scattered reflection occurs due to a non-uniform surface thickness of the neighbor second metal film, for example an aluminum film, during photolithography, partial chemical mechanical polishing (CMP) for partial planarization is carried out to render the surface thickness of the metal film 250 for the second metal contact plug uniform, followed by photolithography, or photolithography may be carried out using OBARC as a material applied prior to photoresist film coating, in order to minimize the effects of underlayers in performing photo-etching.

In this embodiment, the second metal contact plug 255 and second metal film pattern 260 are formed using one metal film, but they may be formed using different metal films, if desired.

Figure 3:
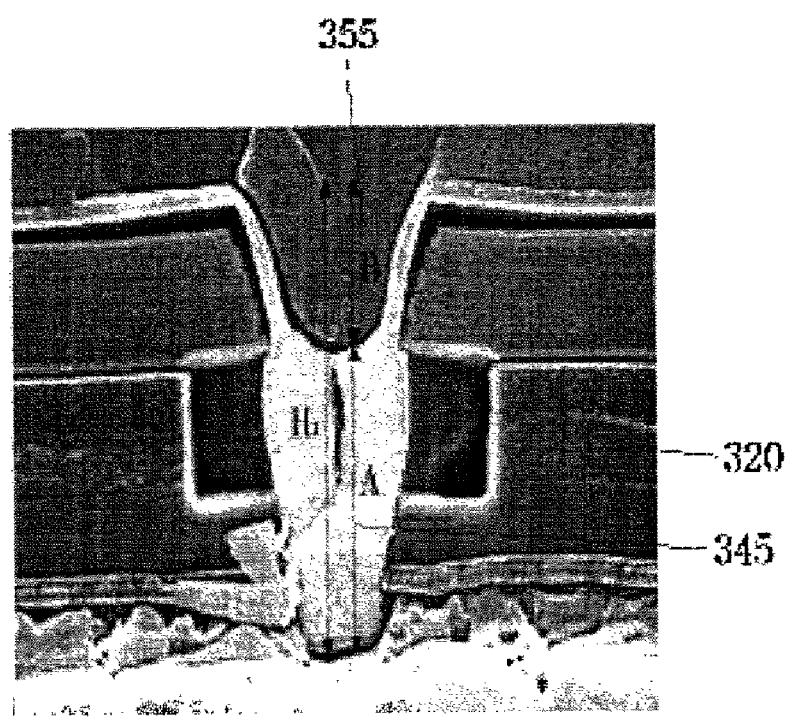
FIG. 3 is an SEM showing a metal interconnection structure of a semiconductor device in accordance with the present invention.

FIG. 3 is a photograph showing a metal contact plug formed by a method of fabricating a metal interconnection structure of a semiconductor device in accordance with the embodiment of the present invention.

Referring to FIG. 3, a via-hole within an intermetallic dielectric film 320 is sequentially filled by a first metal contact plug 345 and a second metal contact plug 355(B), and it can be confirmed that a first metal contact plug 345 (A), namely a tungsten film and a second contact plug/second metal film pattern 355(B) on the first metal contact plug 345 are formed over the total depth (H1) of the via-hole.

As apparent from the above description, in accordance with a method of fabricating a metal interconnection structure of a semiconductor device of the present invention, it is possible to form a metal contact plug consisting of different materials by removing an upper part of the metal contact plug to a predetermined thickness and filling the removed region with a second metal film-forming material having a lower specific resistance than a metal contact plug-forming material. Accordingly, it is possible to minimize the overall resistance of the device as resistance of the metal contact plug is lowered depending upon the filling ratio of the second metal film filled on the removed metal contact plug.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal interconnection structure of a semiconductor device having a low resistance, comprising:
    a first metal film pattern disposed on an upper part of an insulation film of a semiconductor substrate;
    an intermetallic dielectric film disposed on the first metal film pattern and the insulation film, and having a via-hole exposing an upper surface of the first metal film pattern;
    a metal barrier layer disposed on side walls and a lower surface of the via-hole;
    a first metal contact plug disposed on a lower part of the via-hole such that the first metal contact plug connects the upper surface of the first metal film pattern through the metal barrier layer, and made of a metal film having a first specific resistance;
    a second metal contact plug disposed on the upper part of the first metal contact plug while filling the upper part of the via-hole, and made of a metal film having a second specific resistance lower than the first specific resistance; and
    a second metal film pattern disposed on the second metal contact plug and intermetallic dielectric film.

2. The metal interconnection structure according to claim 1, wherein the first metal contact plug is disposed within 65% of the height of the via-hole from the lower part thereof.

3. The metal interconnection structure according to claim 1, wherein the first metal contact plug is formed of a tungsten film, and the second metal contact plug is formed of an aluminum film.

4. The metal interconnection structure according to claim 1, wherein the second metal film pattern is the same metal film as the second metal contact plug.

5. The metal interconnection structure according to claim 1, wherein the second metal film pattern is formed of an aluminum film or a copper film.

* * * * *